(12) United States Patent
Iwasaki et al.

(10) Patent No.: US 10,770,264 B2
(45) Date of Patent: Sep. 8, 2020

(54) INTERFERENCE OPTICAL SYSTEM UNIT, CHARGED PARTICLE BEAM INTERFERENCE APPARATUS, AND METHOD FOR OBSERVING CHARGED PARTICLE BEAM INTERFERENCE IMAGE

(71) Applicant: RIKEN, Wako-shi, Saitama (JP)

(72) Inventors: Yoh Iwasaki, Wako (JP); Ken Harada, Wako (JP); Keiko Shimada, Wako (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 16/360,812

(22) Filed: Mar. 21, 2019

(65) Prior Publication Data

US 2019/0295816 A1 Sep. 26, 2019

(30) Foreign Application Priority Data

Mar. 22, 2018 (JP) .................................. 2018-054280

(51) Int. Cl.
*H01J 37/26* (2006.01)
*H01J 37/141* (2006.01)
*H01J 37/147* (2006.01)

(52) U.S. Cl.
CPC ............ *H01J 37/26* (2013.01); *H01J 37/141* (2013.01); *H01J 37/1472* (2013.01); *H01J 2237/04922* (2013.01); *H01J 2237/1514* (2013.01); *H01J 2237/2614* (2013.01)

(58) Field of Classification Search
USPC ....................................................... 250/311
See application file for complete search history.

(56) References Cited

U.S. PATENT DOCUMENTS

| 7,538,323 B2 | 5/2009 | Harada et al. | |
| 2006/0124850 A1* | 6/2006 | Matsumoto | H01J 37/023 250/310 |
| 2009/0206256 A1* | 8/2009 | Harada | H01J 37/26 250/310 |
| 2010/0252735 A1* | 10/2010 | Hytch | H01J 37/26 250/311 |

FOREIGN PATENT DOCUMENTS

| JP | 4512180 B2 | 7/2010 |
| WO | 2010026867 A1 | 3/2010 |
| WO | 2011122139 A1 | 10/2011 |

* cited by examiner

*Primary Examiner* — Kiet T Nguyen
(74) *Attorney, Agent, or Firm* — Miles & Stockbridge, P.C.

(57) ABSTRACT

An interference optical system unit includes at least one electromagnetic lens that forms an image of a charged particle beam, at least one charged particle beam biprism, and a support member for the electromagnetic lens and the charged particle beam biprism. The electromagnetic lens, the charged particle beam biprism, the support member, and a space to an image plane of the electromagnetic lens are integrally configured as one unit. The interference optical system unit is disposed to have an optical axis coaxialized with an optical axis of an imaging optical system of an upstream stage that is disposed on an upstream side of the unit in a flow direction of the charged particle beam. A focal length of the electromagnetic lens and a deflection angle of the charged particle beam given by the charged particle beam biprism are controlled to generate an interference fringe of the charged particle beam on the image plane of the electromagnetic lens.

15 Claims, 12 Drawing Sheets

FIG. 7

| MODE | PARAMETERS CONVERTED FOR SPECIMEN PLANE | MAGNIFICATION IMAGING OPTICAL SYSTEM OF FRONT STAGE | PARAMETERS ON INTERFERENCE SYSTEM OBJECT PLANE | FINAL MAGNIFICATION |
|---|---|---|---|---|
| HR | s=0.025nm<br>W=0.025μm | ×200<br>Obj: ×20<br>Int1: ×10<br>Int2: ×1 | s=5nm<br>W=5μm | ×2,400,000<br>s=60μm<br>W=60mm |
| MM | s=0.5nm<br>W=0.5μm | ×10<br>Obj: ×1<br>Int1: ×10<br>Int2: ×1 | s=5nm<br>W=5μm | ×120,000<br>s=60μm<br>W=60mm |
| LM | s=10nm<br>W=10μm | ×0.5<br>Obj: Off<br>Int1: ×0.5<br>Int2: ×1 | s=5nm<br>W=5μm | ×6,000<br>s=60μm<br>W=60mm |
| SHR | s=0.005nm<br>W=0.005μm | ×1000<br>Obj: ×20<br>Int1: ×10<br>Int2: ×5 | s=5nm<br>W=5μm | ×12,000,000<br>s=60μm<br>W=60mm | s IS SPATIAL PERIOD OF INTERFERENCE FRINGE (INTERFERENCE FRINGE SPACING), AND W IS WIDTH OF REGION COVERED WITH INTERFERENCE FRINGE ON IMAGE

FIG. 8

| MAGNIFICATION INTERFERENCE OPTICAL SYSTEM | PARAMETERS ON INTERFERENCE SYSTEM OBJECT PLANE | PARAMETERS ON INTERFERENCE SYSTEM IMAGE PLANE | PARAMETERS ON SECOND MAGNIFICATION SYSTEM IMAGE PLANE | MAGNIFICATION OF SECOND MAGNIFICATION IMAGING SYSTEM |
|---|---|---|---|---|
| ×1 | s=5nm<br>W=5μm | s=5nm<br>W=5μm | s=60μm<br>W=60mm | ×1,200 |
| ×10 | s=5nm<br>W=5μm | s=50nm<br>W=50μm | s=60μm<br>W=60mm | ×120 |
| ×50 | s=5nm<br>W=5μm | s=250nm<br>W=250μm | s=60μm<br>W=60mm | ×24 |
| ×100 | s=5nm<br>W=5μm | s=500nm<br>W=500μm | s=60μm<br>W=60mm | ×12 |

INTERFERENCE OPTICAL SYSTEM UNIT, CHARGED PARTICLE BEAM INTERFERENCE APPARATUS, AND METHOD FOR OBSERVING CHARGED PARTICLE BEAM INTERFERENCE IMAGE

TECHNICAL FIELD

The present invention relates to a sample image observation technique based on a charged particle beam interference image using an interference optical system unit.

RELATED ART

While the following descriptions will be given with an electron beam as a representative charged particle beam, the charged particle beam is not limited to the electron beam. An interferometric electron microscope typified by an electron beam holography such as a holographic electron microscope has been achieved with a configuration where an electron biprism, which is an only effectual beam splitter to the electron beam, is inserted into an imaging optical system of a conventional electron microscope. However, there are few cases where an electron optical system having the electron beam holography in the main axis is developed, and its idea is only disclosed in WO2011/122,139. Therefore, up to the present time, the electron biprism is inserted into the optical system in a manner of being inserted between electron lenses. Accordingly, an interference optical system is indivisibly embedded in a magnification imaging system of the electron microscope, and use of the interference optical system as an interferometer requires experiences and skills. For assisting establishment of a method for using the interferometer based on the experiences and the skills and establishment of an optical system, a system assuming a relationship between the optical system and an interference image is proposed (WO2010/026867), while the system has not been achieved up to the present time.

In an observation with the electron microscope, an observation and record with various observation magnifications or an observation with various focuses is performed not only on different target objects contained in a thin piece of a specimen but also on an identical observation target. At this time, when the imaging optical system of the electron microscope is changed to change the observation magnification and the focus condition, conditions of the interference optical system are simultaneously changed, thus an interference fringe spacing and an interference width of the interference image are also changed. Therefore, an analysis of a hologram as the interference image for detecting phase distribution of an electron beam (electron wave) requires correction of a reproduction program each time, thus depending on a computing speed of an image reproduction processing system. Then, a dynamic observation and an efficient observation have required a high performance computer system.

In consideration of the above-described problems, an object of the present invention is to provide an interference optical system unit where conditions of an interference optical system relative to an image detector system are not changed even if a sample image observation magnification and a focus condition of a charged particle beam image observation device are changed.

SUMMARY

In order to achieve the above-described object, the present invention provides an interference optical system unit that includes at least one electromagnetic lens that forms an image of a charged particle beam, at least one charged particle beam biprism, and a support member for the electromagnetic lens and the charged particle beam biprism. The electromagnetic lens, the charged particle beam biprism, the support member, and a space to an image plane of the electromagnetic lens are integrally configured as one unit. The interference optical system unit is disposed to have an optical axis coaxialized with an optical axis of an imaging optical system of a charged particle beam device, the imaging optical system is disposed on an upstream side of the unit in a flow direction of the charged particle beam. A focal length of the electromagnetic lens and a deflection angle of the charged particle beam given by the charged particle beam biprism are controlled to generate an interference fringe of the charged particle beam on the image plane of the electromagnetic lens.

In order to achieve the above-described object, the present invention provides a charged particle beam interference apparatus that includes a light source of a charged particle beam, an irradiation optical system, a specimen holding device, an objective lens system, an imaging optical system, an interference optical system, and a detection recorder. The irradiation optical system irradiates a specimen with the charged particle beam emitted from the light source of the charged particle beam. The specimen holding device holds the specimen irradiated with the charged particle beam. The objective lens system includes at least one electromagnetic lens to form an image of the specimen. The imaging optical system includes at least two electromagnetic lenses to magnify and form or demagnify and form the image of the specimen formed by the objective lens system. The interference optical system makes the image of the specimen formed by the imaging optical system an interference image. The detection recorder detects and records the interference image of the specimen. The light source of the charged particle beam, the irradiation optical system, the specimen holding device, the objective lens system, the imaging optical system, the interference optical system, and the detection recorder are disposed in this order along a flow direction of the charged particle beam. The interference optical system includes at least one electromagnetic lens that forms an image of a charged particle beam, at least one charged particle beam biprism, and a support member for the electromagnetic lens and the charged particle beam biprism. The electromagnetic lens, the charged particle beam biprism, the support member, and a space to an image plane of the electromagnetic lens are integrally configured as one unit. An image forming magnification of the specimen is changed by the electromagnetic lens included in the imaging optical system disposed upstream with respect to the interference optical system.

Further, in order to achieve the above-described object, the present invention provides a method for observing a charged particle beam interference image using a charged particle beam interference apparatus. The charged particle beam interference apparatus includes a light source of a charged particle beam, an irradiation optical system, a specimen holding device, an objective lens system, an imaging optical system, an interference optical system, and a detection recorder. The irradiation optical system irradiates a specimen with the charged particle beam emitted from the light source of the charged particle beam. The specimen holding device holds the specimen irradiated with the charged particle beam. The objective lens system includes at least one electromagnetic lens to form an image of the specimen. The imaging optical system includes at least two electromagnetic lenses to magnify and form or demagnify and form the image of the specimen formed by the objective lens system. The interference optical system makes the image of the specimen formed by the imaging optical system an interference image. The detection recorder detects and records the interference image of the specimen. The light source of the charged particle beam, the irradiation optical system, the specimen holding device, the objective lens system, the imaging optical system, the interference optical system, and the detection recorder are disposed in this order along a flow direction of the charged particle beam. An imaging condition is kept to a preliminarily fixed constant condition in the optical system including the interference optical system and its downstream side. The setting and a change of an imaging magnification of the specimen is performed using the electromagnetic lens included in the imaging optical system disposed on the upstream side of the interference optical system excluding the interference optical system.

With the present invention, after the completion of the adjustment of the optical system and the determination of the conditions of the interference image with the image detector system, the conditions of the interference image become constant, and this eliminates the need for readjustment of parameters of an image processing system in a phase image analysis. This ensures effective and high-speed analysis.

BRIEF DESCRIPTION OF THE DRAWINGS

FIG. 7 is a drawing illustrating a relationship between parameters and an imaging optical system of a upstream stage for each mode of the third embodiment;

FIG. 8 is a drawing illustrating a relationship between magnifications of the interference optical system and a second imaging optical system of the third embodiment;

DESCRIPTION OF THE PREFERRED EMBODIMENTS

Figure 1A:
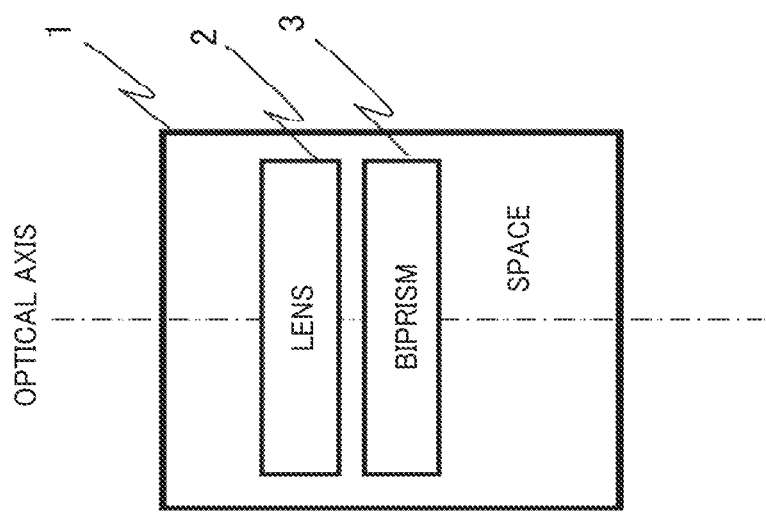
FIGS. 1A and 1B are drawings illustrating one exemplary configuration of an interference optical system unit according to a first embodiment.

The following describes embodiments of the present invention with reference to the drawings. Like reference numerals designate corresponding or identical elements in the drawings. An interference optical system unit of the present invention includes a charged particle beam biprism and an electromagnetic lens, and the interference optical system unit is an optical system unit configured to form an interference image. An upstream imaging optical system (referred to as a first imaging optical system) including an objective lens system immediately below a specimen and an interference optical system unit are arranged in this order in a flow direction of a charged particle beam. Then, for projecting an image on a detection recorder such as a CCD camera disposed on a most downstream side with an appropriate magnification, the interference optical system unit may internally include an imaging optical system, or an imaging optical system may be disposed separately from the interference optical system unit on a downstream side of the interference optical system unit and on a side of a device to be incorporated. This imaging optical system is referred to as a second imaging optical system.

Imaging characteristics, that is, a magnification rate, a resolution, an image rotation correction, and the like, that the conventional electron microscope has are provided by the first imaging optical system alone. Then, the first imaging optical system is configured to include an aberration correction device. While a double-biprism interferometer is assumable for the interference optical system unit, the interference optical system unit is not limited to this. The electromagnetic lens on the upstream side in the interference optical system unit has a magnification of about ×1 to ×100. Increasing the magnification of the electromagnetic lens on the upstream side in the interference optical system unit can reduce a load on the second imaging optical system. Use of a strongly excited lens for the lens of the interference optical system unit can reduce changes on the interference image and interference conditions when an irradiation optical system is changed (see WO2011/122139).

First Embodiment

The first embodiment is an embodiment of the above-described interference optical system unit of the present invention. The interference optical system unit of the first embodiment includes at least one electromagnetic lens (hereinafter referred to as a lens) that forms an image of a charged particle beam, at least one charged particle beam biprism (hereinafter referred to as a biprism), and a support member for the lens and the biprism. The lens, the biprism, the support member, and a space to an image plane of the lens are integrally configured as one unit. The interference optical system unit of the first embodiment is disposed to have an optical axis coaxialized with an optical axis of an imaging optical system of an upstream stage disposed on an upstream side of the unit in a flow direction of the charged particle beam. A focal length of the lens and a deflection angle of the charged particle beam given by the biprism are controlled to generate an interference fringe of the charged particle beam on the image plane of the lens.

Figure 1B:
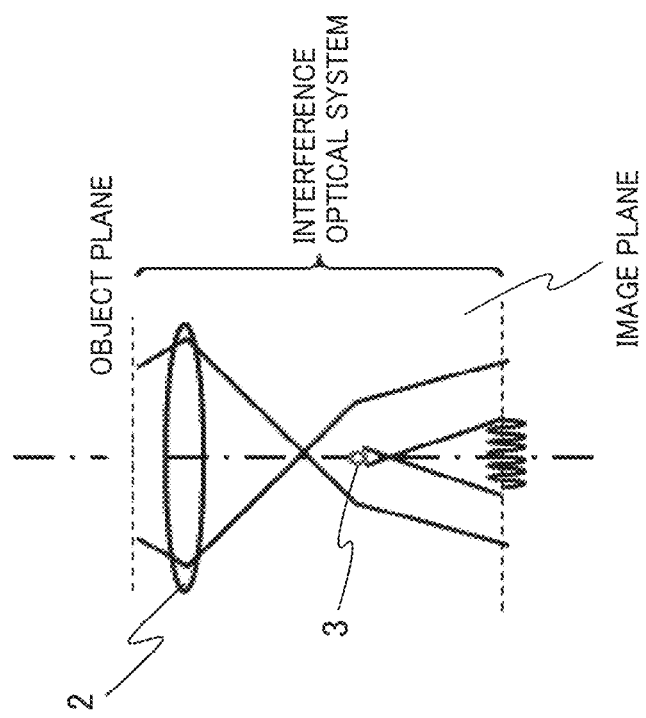

FIGS. 1A and 1B illustrate the interference optical system unit of the first embodiment. FIG. 1A illustrates an arrangement order of components having functions along the optical axis. FIG. 1B illustrates a state of propagation of the charged particle beam. An interference optical system unit 1 of this embodiment includes a lens 2, a biprism 3, and a support member (not illustrated) for them. The interference optical system unit 1 is configured as an integrated structure that includes the lens 2, the biprism 3, the support member, and a space to an image plane of the lens 2 as one unit. The interference optical system unit 1 thus configured ensures photographing and recording an electron microscope image as the interference image with the detection recorder by, for example, disposing the interference optical system unit 1 so as to have the common optical axis with an electron optical system of the electron microscope.

That is, the interference optical system unit of this embodiment is an interference optical system where conditions of the interference optical system relative to the detection recorder such as a CCD camera system, that is, an interference fringe spacing and an interference width are not changed even if a sample image observation magnification and a focus condition of a charged particle beam image observation device are changed. Then, the interference optical system unit of this embodiment is a unit having the fixed conditions without the need for complicated adjustment by the user.

Figure 2B:
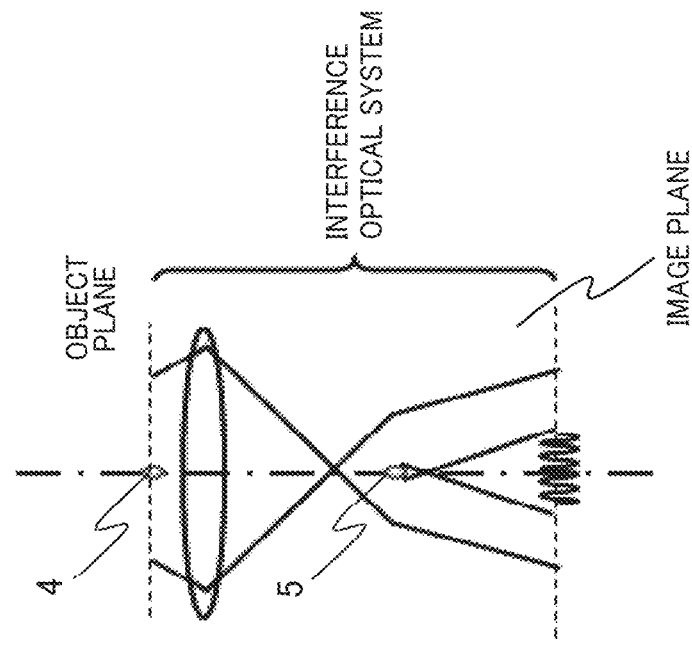
FIGS. 2A and 2B are drawings illustrating an exemplary configuration of a modification of the interference optical system unit according to the first embodiment.
Figure 2A:
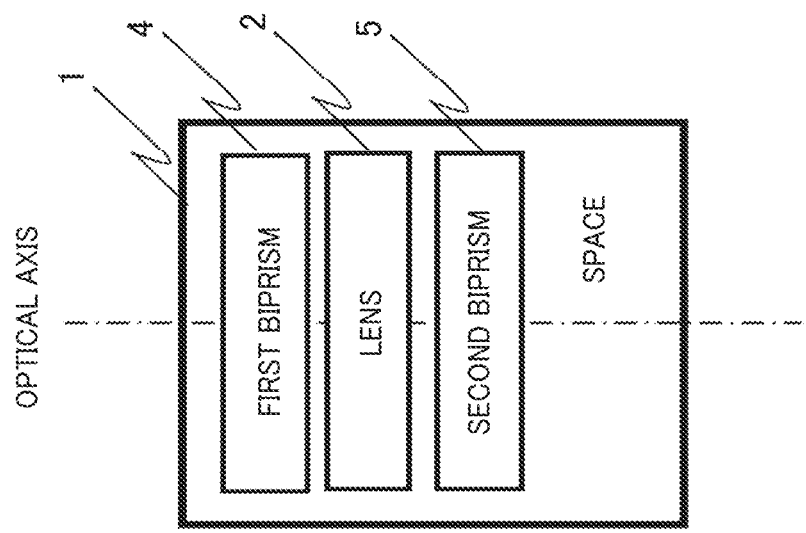

FIGS. 2A and 2B illustrate an exemplary configuration of a modification of the interference optical system unit of the embodiment. This modification is an interference optical system unit that includes two biprisms. The interference optical system unit has a configuration where a first biprism of the tow biprisms is disposed on an object plane of a lens and a second biprism is disposed between a back focal plane of this lens and an image plane. In this configuration, use of the two biprisms ensures formation of an interference fringe where Fresnel stripes are not superimposed.

Similarly to FIGS. 1A and 1B, FIGS. 2A and 2B illustrate an arrangement order of components having functions along the optical axis and a state of propagation of the charged particle beam, respectively. The interference optical system unit 1 includes a first biprism 4, the lens 2, a second biprism 5, and the support member (not illustrated) for them. The interference optical system unit 1 is configured as an integrated structure that includes the lens 2, the biprisms 4 and 5, the support member, and a space to an image plane of the lens 2 as one unit.

Use of thus configured interference optical system unit 1 of FIGS. 2A and 2B ensures an advantage on the interference image observation provided by a method where the two biprisms are advantageously used (see Japanese Patent No. 4512180) compared with the case where the configuration illustrated in FIGS. 1A and 1B is used. That is, the advantage is that the interference fringe where the Fresnel stripes are not superimposed can be formed, and that a period (interval) of the interference fringe and a size of a region covered with the interference fringe (interference width) can be independently selected and controlled.

Figure 3A:
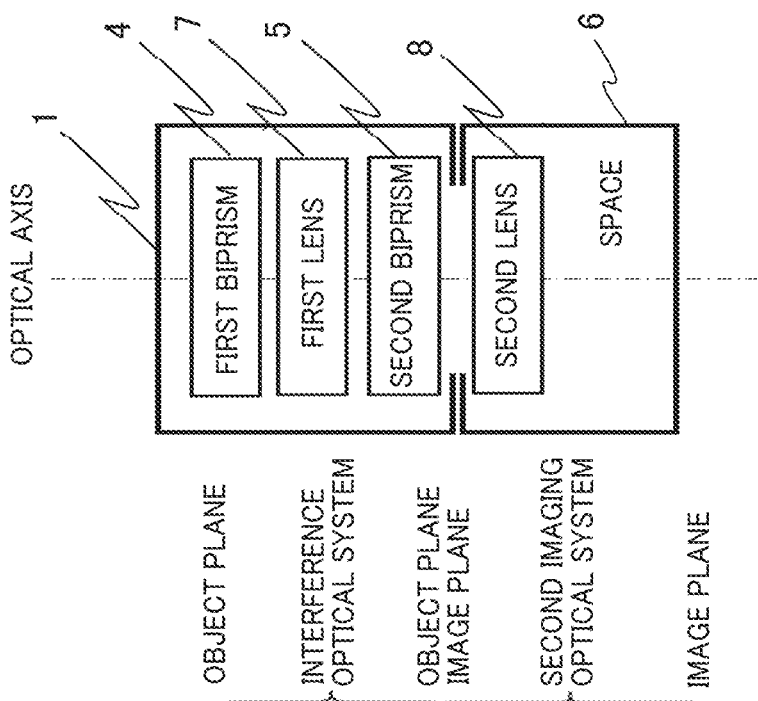
FIGS. 3A to 3C are drawings illustrating one exemplary configuration of the interference optical system unit that includes an optical system sub unit according to the first embodiment.
Figure 3B:
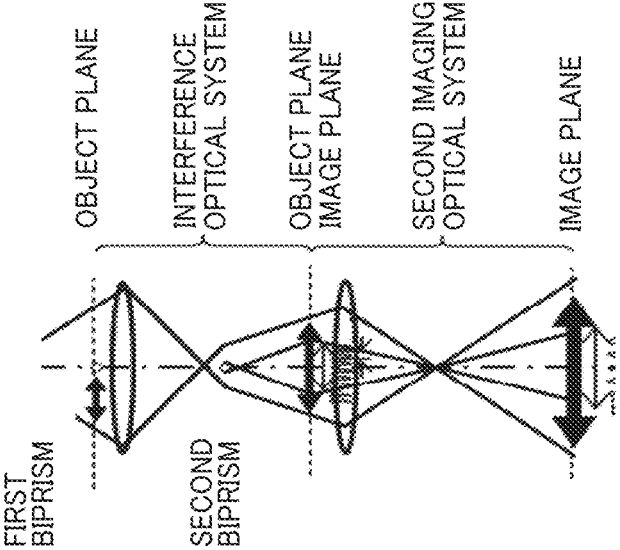
Figure 3C:
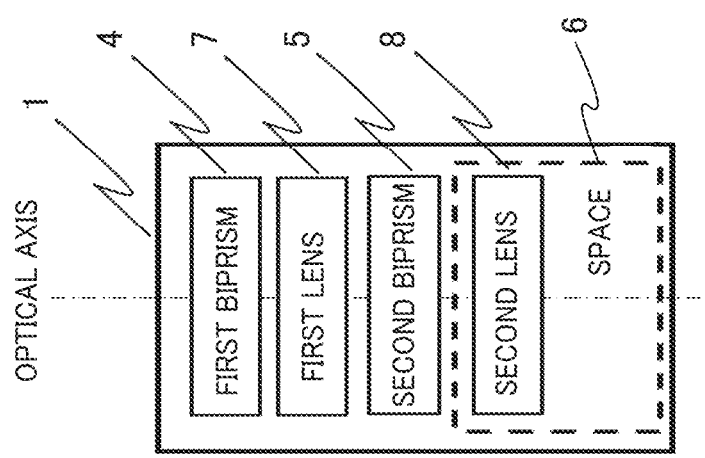

As illustrated in FIGS. 3A to 3C, an optical system sub unit 6 that includes a second lens 8 is incorporated further downstream with respect to an optical system part including the first and second biprisms 4 and 5 illustrated in FIGS. 2A and 2B and a first lens 7. That is, the interference optical system unit integrally includes the second imaging optical system and a space to an image plane of the second imaging optical system an optical system sub unit. The second imaging optical system forms an image with the image plane of the first lens as an object plane, and includes at least one second lens. The second imaging optical system has an optical axis coaxialized with the optical axis of the optical system of the interference optical system unit.

This configuration expands a range of the magnification available with the interference optical system unit of the first embodiment. The rotation of the image caused by the first lens 7 of a first stage can be canceled by the combination with the second lens 8 of a second stage, thus the advantage of preventing the rotation of the image is provided as a whole of the interference optical system unit of the embodiment. Similarly to FIGS. 1A and 1B, FIGS. 3A and 3B illustrate an arrangement order of components having functions along the optical axis and a state of propagation of the charged particle beam, respectively. Further, as illustrated in FIG. 3C, the second imaging optical system that includes the second lens 8 can be fabricated as the optical system sub unit 6 separately from the interference optical system unit 1 for convenience of assembling the apparatus.

With the above-described first embodiment, after the completion of the adjustment of the optical system and the determination of the interference fringe spacing and the interference width as the conditions of the interference image with the image detector system, the conditions of the interference image become constant, and this eliminates the need for readjustment of parameters of an image processing system in a phase image analysis, thus ensuring effective and high-speed analysis. Especially, since an interference effect can be kept constant in a plurality of interference microscope images, the effects are expected in the analysis work to collectively process a plurality of holograms such as a dynamic observation and a tomography observation. An experimenter can perform the interference image observation with experimental operations completely identical to those on the electron microscope without consideration for the interference optical system.

Second Embodiment

While the above-described interference optical system unit of the first embodiment is used in combination with the optical system other than this unit, it is necessary to coaxially align the optical axes of both optical systems in the use. As means to coaxialize the optical axes, a deflector configured to change a propagation direction of the charged particle beam is usually used.

The second embodiment is an embodiment of a configuration where a deflector of one stage is disposed on an upstream end of the interference optical system unit of the first embodiment in order to achieve facilitated and more precise coaxialization of the optical axes of the interference optical system unit and the upstream optical system. That is, the second embodiment is an embodiment of an interference optical system unit that includes at least one deflector configured to deflect a flow direction of the charged particle beam in a direction having a finite angle with a z-axis when an optical axis of an optical system of a charged particle beam device other than the interference optical system unit is assumed to be the z-axis.

Figure 4A:
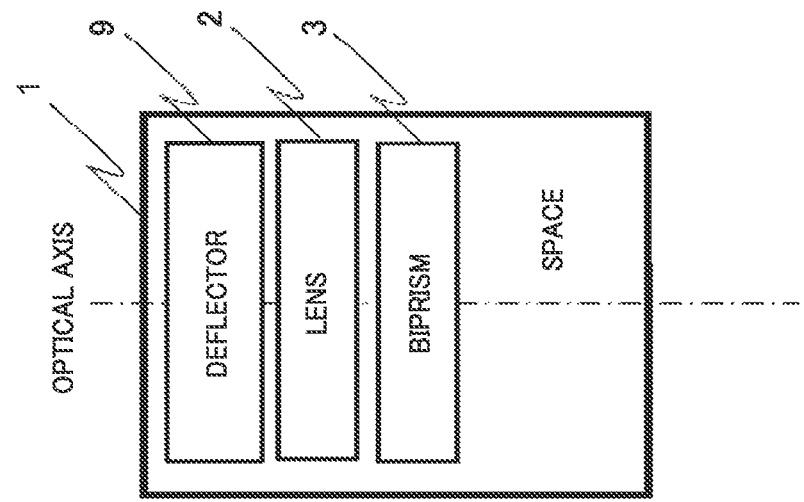
FIGS. 4A and 4B are drawings illustrating an interference optical system unit that includes a deflector at an upstream end according to a second embodiment.
Figure 4B:
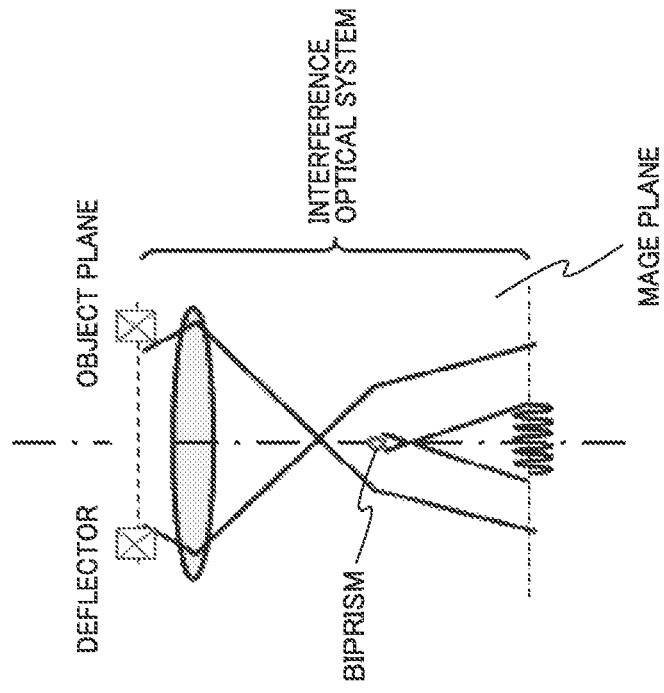

As illustrated in FIGS. 4A and 4B, the interference optical system unit 1 in the second embodiment includes a deflector 9 of one stage on the upstream side of the interference optical system unit 1 that includes the lens 2 and the biprism 3. FIGS. 4A and 4B illustrate an arrangement order of components having functions along the optical axis and a state of propagation of the charged particle beam, respectively. A deflector may be disposed as necessary on a lower portion of the interference optical system unit to coaxialize the optical axis of the other optical system, for example, the second imaging optical system, incorporated further downstream with respect to the interference optical system unit 1.

Figure 5B:
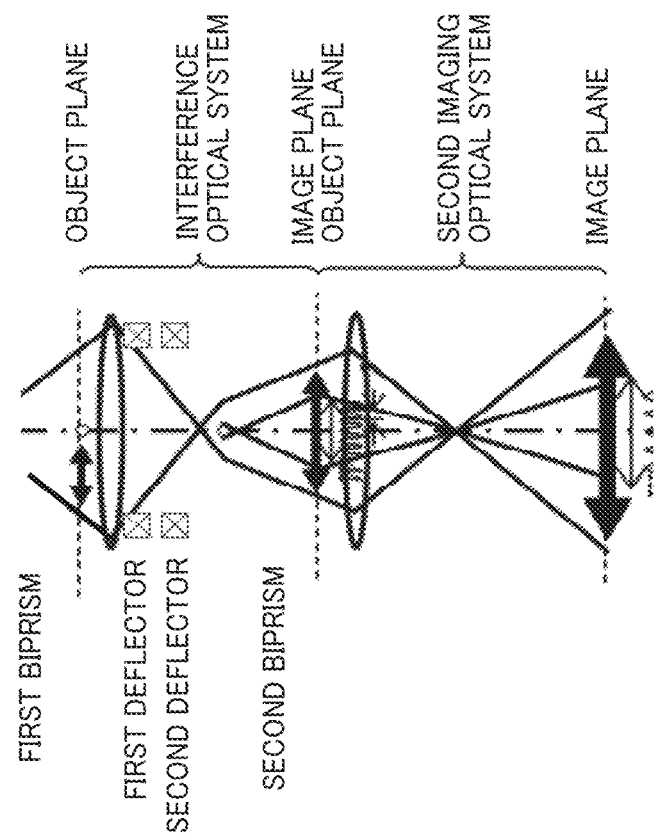
FIGS. 5A and 5B are drawings illustrating an exemplary configuration of a modification of the interference optical system unit that includes the deflector according to the second embodiment.
Figure 5A:
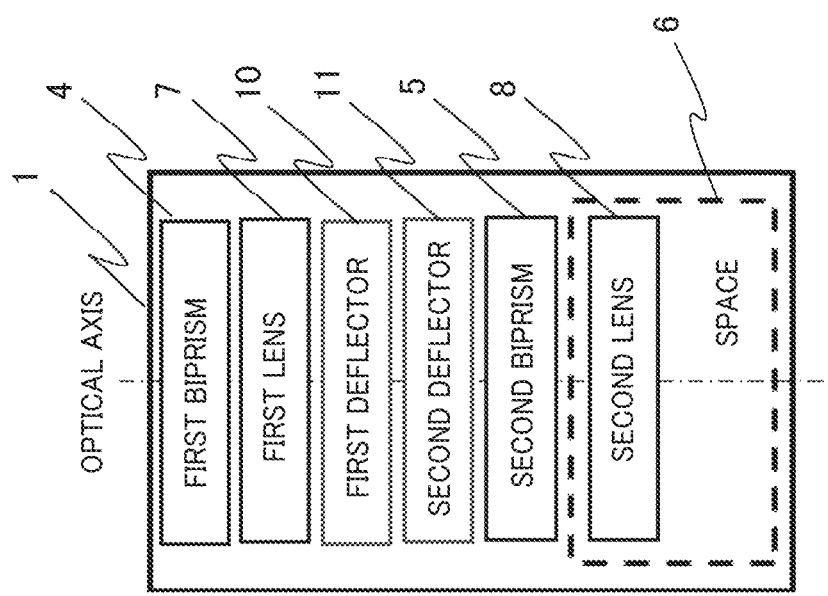

As illustrated in FIGS. 5A and 5B, when the first lens 7 and the second lens 8 are included as the lenses of a plurality of stages inside the interference optical system unit 1, first and second deflectors 10 and 11 are disposed between these lenses of the plurality of stages to ensure the facilitated and more precise mutual coaxialization of the optical axes of the lenses. Thus, disposing the deflectors, which are configured to change the direction of the charged particle beam in both x and y directions perpendicular to a z-direction by any amount, in two stages along the z-axis ensures the control of both the direction of the charged particle beam and the position where the charged particle beam passes through.

Third Embodiment

The third embodiment is an embodiment of a charged particle beam device where the interference optical system unit of the first embodiment illustrated in FIGS. 3A to 3C is combined with the electron microscope, and an embodiment of a configuration where an imaging action by the one-stage lens included in the interference optical system part of the interference optical system unit is performable with any magnification from two times to 50 times. The third embodiment is an embodiment of an interference optical system unit that further includes a detection recorder to record the interference image.

Figure 6:
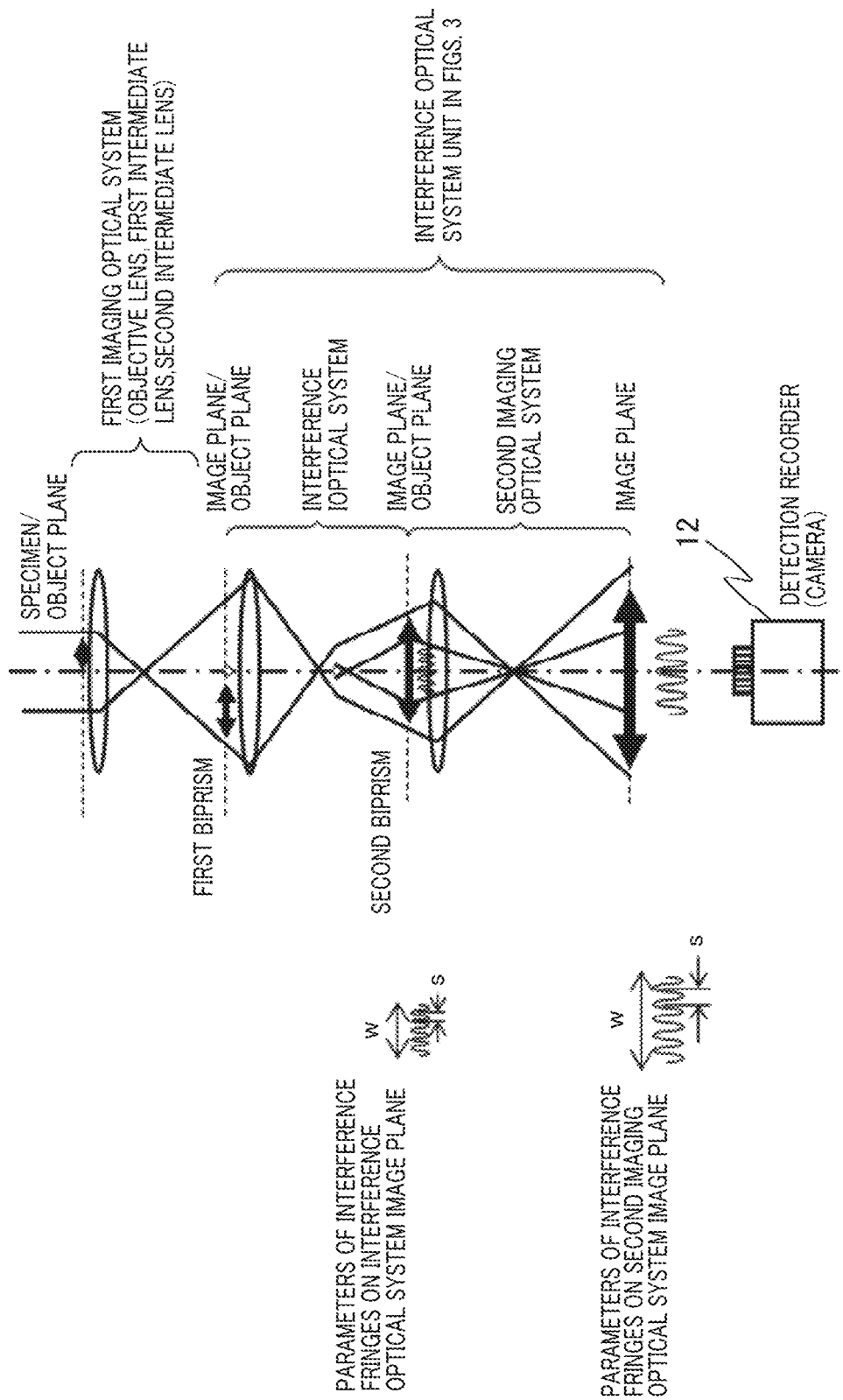
FIG. 6 is a drawing illustrating a configuration of a charged particle beam device where an interference optical system unit is combined with an electron microscope according to a third embodiment.

In the configuration of the embodiment, an electron source, an irradiation optical system, and a specimen holding mechanism are included from the upstream side in a vacuum container. Then, as illustrated in FIG. 6, an objective lens (Obj) and middle lenses (Int1 and Int2) of two stages are disposed on the downstream side of the specimen held onto the specimen holding mechanism, and these lenses act as the imaging optical system of the upstream stage with respect to the interference optical system unit described with reference to FIGS. 3A to 3C. On the further downstream side of the interference optical system unit described with reference to FIGS. 3A to 3C, a detection recorder 12 configured to record the interference image is disposed.

Here, for example, a 4k×4k CCD camera (15 μm/pixel) is used as the detection recorder 12 of the image. As phase analysis means of the output signal of the detection recorder 12, a fast Fourier transformation (FFT) method is assumed, and an image formation of 4 pixels/fringe, which is 60 μm/fringe, is performed on a CCD camera plane. The interference region is assumed to be 1000 fringes, that is, 60 mm as the whole plane of a CCD plane on the CCD camera plane. Then, the resolution is assumed to have a high resolution (HighReso) mode, a middle magnification (MidMag) mode, and a low magnification (LowMag) mode, and in addition, a super high resolution (SuperHR) mode.

FIG. 7 illustrates Table 70 indicating a relationship between parameters and the imaging optical system of the upstream stage for each of the above-described four modes. In FIG. 7, s is a spatial period of the interference fringe, that is, an interference fringe spacing, and W is a width of a region covered with the interference fringe on an image. As illustrated in FIG. 7, it is seen that the requirement that the interference fringe covers the whole CCD plane with 60 μm/fringe on the CCD plane can be achieved in every mode of HR, MM, LM, and SHR. Here, it is highly important that the above-described requirement is consistently satisfied with any magnification rate of a magnification imaging optical system of the electron microscope served as the optical system of the upstream stage disposed upstream with respect to the interference optical system unit.

Next, as indicated in Table 80 in FIG. 8, the magnification of the interference optical system unit including the second imaging optical system can be a large value of 1000 times or more seen from the relationship between the magnification of the interference optical system and the second imaging optical system. However, the magnification rate of about several tens of times is easily prepared with the one-stage lens. That is, the interference optical system unit having the magnification rate in a range of two times to 50 times as the magnification of the interference optical system part is valuable in practical use.

Figure 9A:
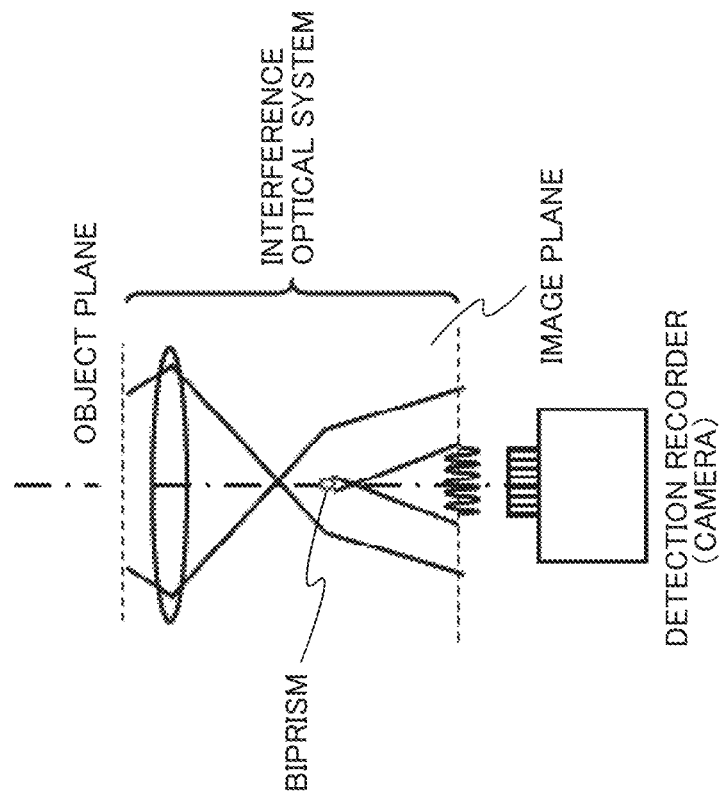
FIGS. 9A and 9B are drawings illustrating one exemplary configuration of an interference optical system unit including a detection recorder 12 according to the third embodiment.
Figure 9B:
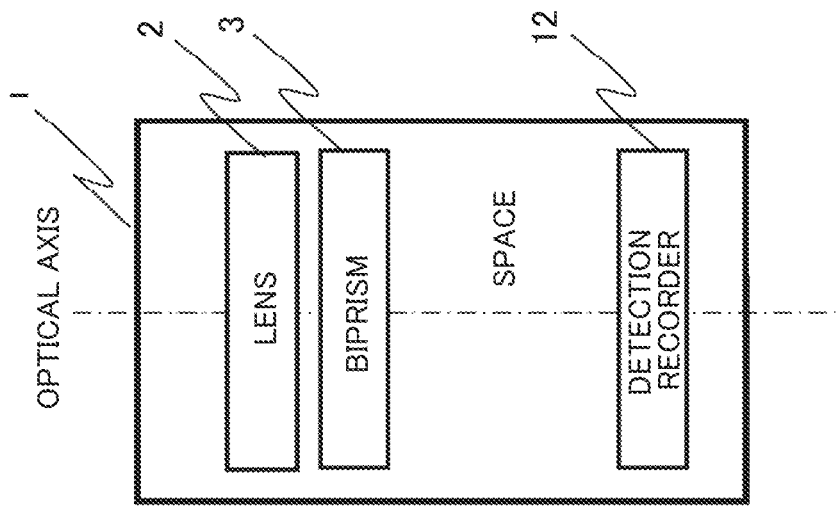

In this embodiment, for the case where the interference optical system unit is used in combination with the optical system of the electron microscope, the interference optical system unit can be provided as an integrated unit where the detection recorder 12 is also included in the interference optical system unit 1 and the coaxialization of the optical axis with the biprism 3 and the lens 2 inside the unit is adjusted and established as illustrated in FIGS. 9A and 9B. FIG. 9A illustrates an arrangement order of components having functions along the optical axis, and FIG. 9B illustrates a state of propagation of the charged particle beam. Simply adding the interference optical system unit 1 integrally including the detection recorder 12 such as a camera to the last stage of an existing electron microscope provides an advantage of simplifying a process compared with the case where the electron microscope is divided into the optical system and the camera, reconstructed into a configuration where the interference optical system unit is interposed, and adjusted.

Fourth Embodiment

The fourth embodiment is an embodiment where the various interference optical system units described in the first embodiment to the third embodiment further include a control system that controls a focal length of the lens included in the interference optical system unit and a deflection angle given to the charged particle beam by the biprism.

Figure 10:
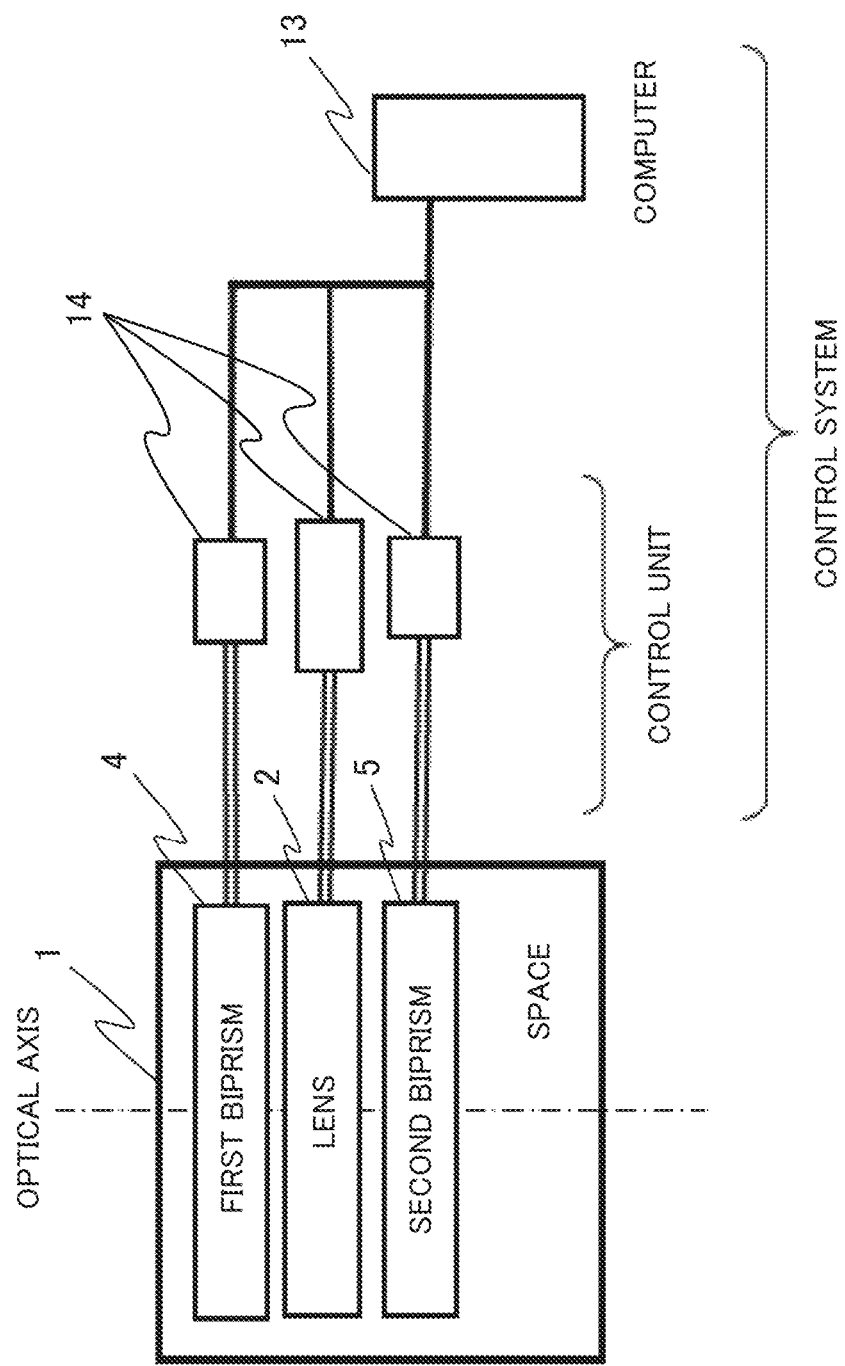
FIG. 10 is a drawing illustrating one exemplary configuration of an interference optical system unit including a control system according to a fourth embodiment.

As illustrated in FIG. 10, the interference optical system unit of the embodiment can integrally include a control unit including voltage application or current supply units 14 that perform voltage application or current supply with an appropriate magnitude necessary for operating the first and second biprisms 4 and 5 and the lens 2 with desired deflection angle and focal length. Furthermore, the control system including a computer 13 added to this control unit for performing the control can be considered as the interference optical system unit.

According to the embodiment, it is appropriate that the voltage application or current supply units 14 to the biprisms and the lens are integrally included because the voltage application or current supply units 14 are indispensable components for operating the biprisms and the lens. The control system including the computer 13 and the like is advantageous to automatization of the complicated setting and operation. In addition, since the imaging conditions of the interference optical system unit 1 are fixed for use, it is important to combine the control system configured to stably apply/supply the voltage/current for a long time like the embodiment.

Fifth Embodiment

The fifth embodiment is an embodiment of a charged particle beam interference apparatus that uses various interference optical system units described in the first embodiment to the fourth embodiment. The charged particle beam interference apparatus includes a light source of a charged particle beam, an irradiation optical system, a specimen holding device, an objective lens system, an imaging optical system, an interference optical system, and a detection recorder in this order along a flow direction of the charged particle beam. The irradiation optical system irradiates a specimen with the charged particle beam emitted from the light source of the charged particle beam. The specimen holding device holds the specimen irradiated with the charged particle beam. The objective lens system includes at least one electromagnetic lens to form an image of the specimen. The imaging optical system includes at least two electromagnetic lenses to magnify and form or demagnify and form the image of the specimen formed by the objective lens system. The interference optical system makes the image of the specimen formed by the imaging optical system an interference image. The detection recorder detects and records the interference image of the specimen. The interference optical system includes at least one electromagnetic lens that forms an image of a charged particle beam, at least one charged particle beam biprism, and a support member for the electromagnetic lens and the charged particle beam biprism. The electromagnetic lens, the charged particle beam biprism, the support member, and a space to an image plane of the electromagnetic lens are integrally configured as one unit. An imaging magnification of the specimen is changed by the electromagnetic lens included in the imaging optical system disposed upstream with respect to the interference optical system.

Figure 11A:
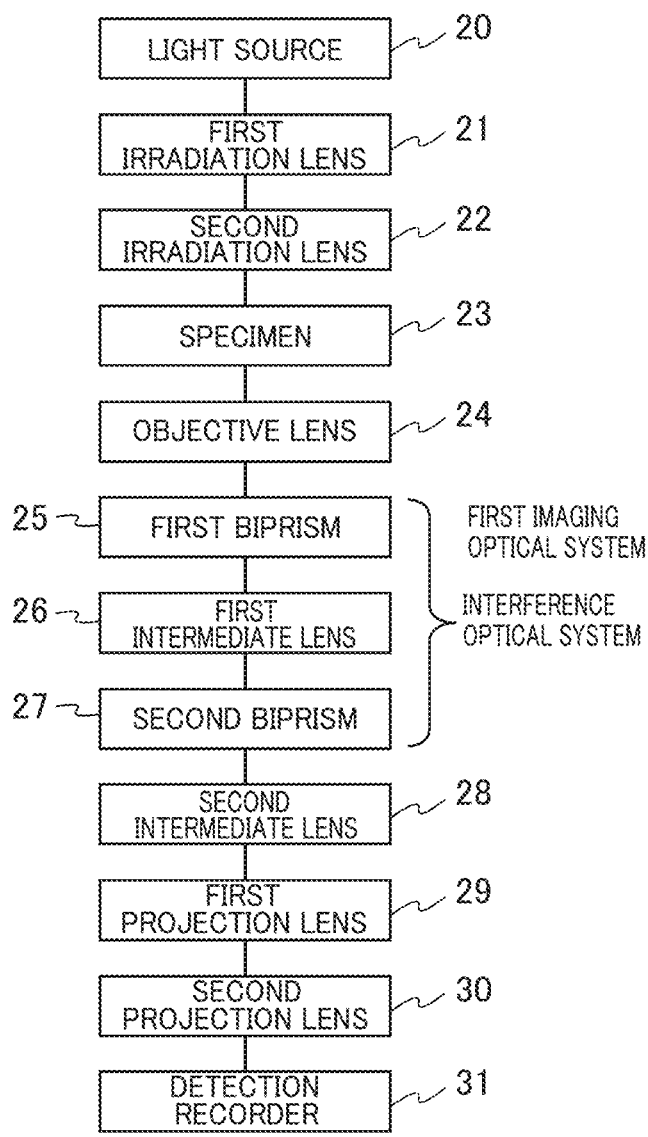
FIGS. 11A and 11B are drawings illustrating one exemplary configuration of an electron beam interference apparatus using an interference optical system unit according to a fifth embodiment.
Figure 11B:
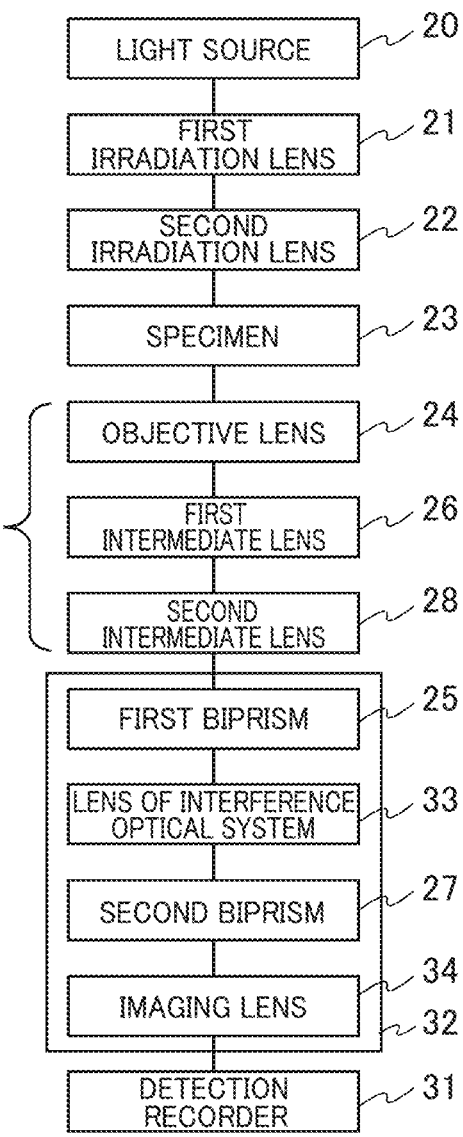

While a description will be given with the electron microscope as an example of the charged particle beam interference apparatus of the embodiment, the configuration is not limited to the electron microscope and the like. FIG. 11A is a schematic diagram of an optical system conventionally used in the interference image observation using the electron microscope, as a comparative example of the configuration of the electron microscope of the embodiment illustrated in FIG. 11B. In the comparative example of FIG. 11A, two biprisms of a first biprism 25 and a second biprism 27 are disposed to obtain the interference image, and a range including both biprisms in the optical system can be considered as the interference optical system. In FIGS. 11A and 11B, a light source 20 of the charged particle beam, an irradiation optical system, a specimen holding device (not illustrated), an objective lens 24, and an imaging optical system are disposed. The irradiation optical system includes irradiation lenses 21 and 22 that irradiate a specimen 23 with the charged particle beam emitted from the light source 20. The specimen holding device holds the specimen 23 irradiated with the charged particle beam. The objective lens 24 forms an image of the specimen 23. The imaging optical system includes at least two middle lenses 26 and 28 to magnify and form or demagnify and form the image of the specimen 23 formed by the objective lens system.

The electron microscope has a magnification rate determined depending on the focal lengths of the objective lens, the intermediate lens, and a projection lens. The period s of the interference fringe and the width W of the region covered with the interference fringe on the camera depend on the focal lengths of a first intermediate lens 26 and the lens downstream with respect to the first middle lens 26 in addition to the applied voltages to the first and second biprisms. In the comparative example, in changing the magnification of the microscope, for the electron microscope, the magnification is ordinarily changed by changing the focal lengths of a second intermediate lens 28 and first and second projection lenses 29 and 30, that is, the lenses positioned downstream with respect to the interference optical system including the interference optical system. Then, at this time, the period s of the interference fringe and the width W of the region covered with the interference fringe on a detection recorder 31 as the camera are also changed. For example, in the conventional electron microscope, the focal lengths of the first intermediate lens, the second intermediate lens, the first projection lens, the second projection lens are complicatedly adjusted to obtain the magnification of the image. In the enlargement from a low magnification to a high magnification, not the simple adjustment to use the above-described every lens in a magnification system but a complicated adjustment, for example, to use the second intermediate lens in a reduction system (for example, in a case of the low magnification) is performed corresponding to the final magnification. This ensures a predetermined image magnification while restricting the image rotation due to a lens magnetic field. However, the interference fringe spacing s and the width W of the region covered with the interference fringe, which are determined by the interference optical system, vary corresponding to the image plane determined by this interference optical system, a position of a crossover of the electron beams, and a position of the biprism (equation 12 (for s) and equation 13 (for W) in Japanese Patent No. 4512180). Then, the enlargement/reduction is not simply performed proportionately to the final magnification. Therefore, it is necessary to readjust the applied voltage to the biprism and the focal length of the lens, which are the imaging conditions of the interference optical system, corresponding to a new magnification.

For example, since every lens is used in the magnification system in the observation of the sample image with the final magnification of two hundred thousand times or more, the optical system has a relatively simple configuration. However, the interference fringe, which covers the sufficient region width W with the appropriate short period on the detection recorder 31 as the camera when the magnification is two hundred thousand times, is to cover a width W' (W'>W) spreading out of an image-capturing surface at a rough period s' (s'>s) on the camera when the magnification is changed higher to million times. Then, an in-plane resolution of the interference measurement is not improved while the image is enlarged. For the above-described reason, it is necessary to readjust the applied voltage to the biprism and the focal length of the lens, which are the imaging conditions of the interference optical system, corresponding to the new magnification.

Meanwhile, in the configuration of the embodiment illustrated in FIG. 11B, an interference optical system unit 32 is positioned on the downstream end of the optical system and the upstream side of the detection recorder 31. The imaging condition of the interference optical system unit of this configuration is premised that: the first biprism 25 on the upstream side is positioned on the object plane of a lens 33 of the interference optical system on the immediately downstream side of the first biprism 25; the adjustment is once performed such that the period s of the interference fringe has appropriate intervals on the detection recorder 31 as the camera and the interference fringe covers the region having the appropriate width W on the camera; and after that, the imaging condition of the interference optical system unit 32 is fixed without being changed. Then, for changing the magnification rate of the sample image, the imaging condition is changed in only the lens system (first imaging optical system) upstream with respect to the interference optical system excluding the interference optical system. At this time, the image plane of the imaging optical system upstream with respect to the interference optical system matches the first biprism 25 on the upstream side in the interference optical system unit 32 both before and after the magnification change. In thus adjusted optical system, the sample image formed on the position of the upstream biprism is superimposed with the upstream biprism to be formed on the detection recorder 31 according to the imaging condition of the interference optical system unit 32.

Since the imaging condition of the interference optical system unit 32 is fixed according to the premise, the magnification change does not cause a change in the interference fringe on the detection recorder 31. Then, the interference fringe covers the appropriate region with the appropriate intervals inside a visual field regardless of the magnification. Accordingly, the configuration of the embodiment eliminates the need for the operation of "the readjustment of the interference optical system in accordance with the magnification change" that the comparative example faces.

While the description has been given with the electron microscope as the example and the configuration where the interference optical system unit includes the two biprisms and the two lenses as the configuration of the embodiment, the type of the charged particle beam interference apparatus and the component of the interference optical system unit are not necessarily limited to them.

That is, in the charged particle beam interference apparatus, the interference optical system unit includes at least one lens that forms an image of the charged particle beam and two biprisms. The first biprism of the two biprisms is disposed on the object plane of the lens, and the second biprism is disposed between the back focal plane of the lens and the image plane. The lens, the biprisms, the support member, and the space to the image plane of the lens are integrally configured as one unit. When the interference optical system unit included in the apparatus includes the two biprisms, there is an advantage that the interference fringe spacing s and the width W of the region covered with the interference fringe can be independently controlled with the applied voltages to the respective biprisms.

The interference optical system unit is configured as the integrated structure that includes the second imaging optical system including at least one lens that forms an image with the image plane of the lens as object plane and the space to the image plane of the second imaging optical system as the optical system sub unit. When the interference optical system unit included in the apparatus includes the two lenses, incorporating the second imaging optical system further downstream with respect to the optical system part including the biprism expands the range of the magnification that can be used by the interference optical system unit. There is an advantage that the image rotation caused by the one-stage electromagnetic lens can be canceled by the combination of the electromagnetic lenses of a plurality of stages so as to prevent the image rotation as the whole unit of the present invention.

Further, as the charged particle beam interference apparatus corresponding to the second embodiment, the charged particle beam interference apparatus can be configured such that the interference optical system unit includes a deflector of the charged particle beam so as to ensure the facilitated and more precise coaxialization of the optical axis of the optical system when the interference optical system unit and the upstream optical system part are combined to be used. For the coaxialization of the optical axis with another optical system combined further downstream with respect to the interference optical system unit, the deflector can be disposed on the lower portion of the interference optical system unit as necessary. When the interference optical system unit internally includes the lenses of a plurality of stages, disposing the deflector between the lenses inside the unit ensures the facilitated and more precise coaxialization of the optical axes between the lenses.

Further, as the charged particle beam interference apparatus corresponding to the third embodiment, the charged particle beam interference apparatus can be configured such that the interference optical system is configured as the integrated unit, and the imaging action by the one-stage lens included in this interference optical system unit is performable with any magnification from two times to 50 times. While the interference optical system unit that includes the second imaging optical system inside the interference optical system unit can have the magnification with the large value of 1000 times or more, the magnification rate of about several tens of times is easily prepared with the one-stage lens. That is, the interference optical system unit having the magnification rate in a range of two times to 50 times as the magnification per one-stage lens is configured to be valuable in practical use.

When the charged particle beam interference apparatus includes the interference optical system configured as the integrated unit and the interference optical system unit is used in combination with the optical system of the interference apparatus, the detection recorder attached to an existing apparatus is used in one case, while a unit including the detection recorder is replaced with the lower end portion of the optical system of the existing interference apparatus and combined in the other case. The former case is advantageous in that the existing equipment can be efficiently used, while the latter case ensures the interference optical system unit fabricated as the integrated unit where the coaxialization of the optical axes is adjusted and established among the biprism and the lens in the interference optical system unit. Simply adding the unit integrally including the camera to the last stage of the electron microscope provides an advantage of simplifying a process compared with the case where the existing interference apparatus is divided into the optical system and the camera, reconstructed into a configuration where the interference optical system unit is interposed, and adjusted.

Further, the charged particle beam interference apparatus corresponding to the fourth embodiment includes the interference optical system as the integrated unit, and includes a control system that controls a focal length of the lens included in the interference optical system unit and a deflection angle given to the charged particle beam by the biprism. The interference optical system unit of the present invention can integrally include the unit that perform voltage application or current supply with an appropriate magnitude necessary for operating the biprism and the lens with desired deflection angle and focal length. Furthermore, the interference optical system unit can include the computer added for performing the control. There is an advantage in that the voltage application or current supply units to the biprisms and the lens and the control system including the computer and the like are integrally included such that the complicated setting and operation are automatized.

The fifth embodiment is an embodiment of a method for observing the charged particle beam interference image using the charged particle beam interference apparatus. That is, the fifth embodiment is an embodiment of the method for observing the charged particle beam interference image that uses the charged particle beam interference apparatus. The charged particle beam interference apparatus includes a light source of a charged particle beam, an irradiation optical system, a specimen holding device, an objective lens system, an imaging optical system, an interference optical system, and a detection recorder in this order along a flow direction of the charged particle beam. The irradiation optical system irradiates a specimen with the charged particle beam emitted from the light source of the charged particle beam. The specimen holding device holds the specimen irradiated with the charged particle beam. The objective lens system includes at least one electromagnetic lens to form an image of the specimen. The imaging optical system includes at least two electromagnetic lenses to magnify and form or demagnify and form the image of the specimen formed by the objective lens system. The interference optical system makes the image of the specimen formed by the imaging optical system an interference image. The detection recorder detects and records the interference image of the specimen. The imaging condition of the interference optical system is kept to the preliminarily fixed constant condition, and the setting and the change of the imaging magnification of the specimen is performed using the electromagnetic lens included in the imaging optical system on the upstream side of the interference optical system excluding the interference optical system. The embodiment of the method for observing the charged particle beam interference image includes a method where, as illustrated in FIG. 3C, in the case of the configuration where the imaging optical system is further disposed on the downstream side of the interference optical system unit, the imaging condition is kept to the preliminarily fixed constant condition in the optical system including the interference optical system and its downstream side, and the setting and the change of the imaging magnification of the specimen is performed using the electromagnetic lens included in the imaging optical system (first imaging optical system) on the upstream side of the interference optical system excluding the interference optical system.

Thus, in the method for observing the charged particle beam interference image of the embodiment, the method for observing the charged particle beam interference image where the imaging condition is kept to the preliminarily fixed constant condition in the optical system including the interference optical system and its downstream side, and the setting and the change of the imaging magnification of the specimen is performable using the lens included in the first imaging optical system provides an advantage that eliminates the need for the readjustment of the interference condition in accordance with the change of the image observation magnification regardless of whether the interference optical system part is unitized or not on the apparatus configuration.

With the above-described various embodiments of the present invention, use of the interference optical system unit of the present invention ensures providing the interference optical system where the condition of the interference optical system to the detection recorder such as the CCD camera system, that is, the interference fringe spacing and the interference width are not changed even if the sample image observation magnification and the focus condition of the charged particle beam image observation device are changed. The interference optical system is provided on the charged particle beam device side as the unit having the fixed condition so as to eliminate the need for the complicated adjustment by the user.

Figure 12B:
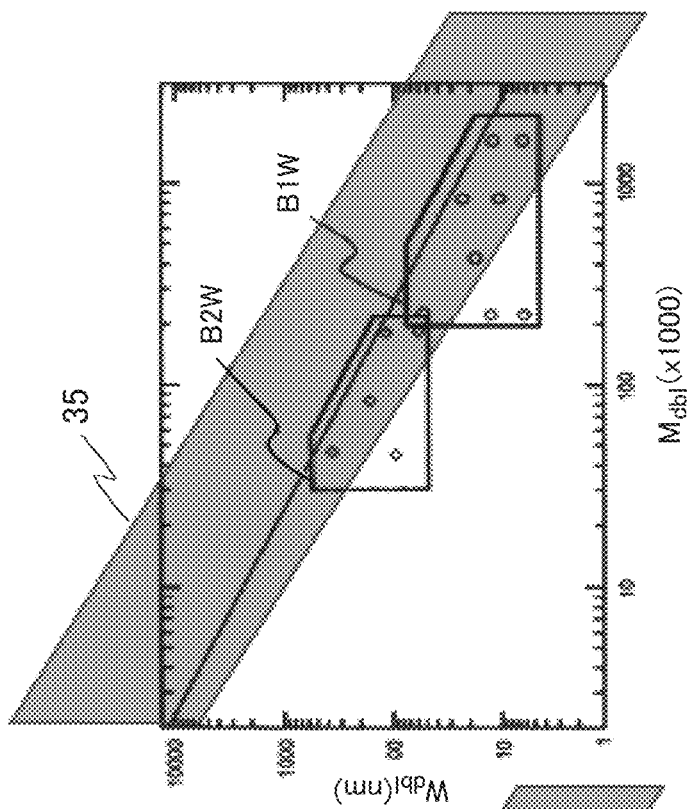
FIGS. 12A and 12B are drawings describing a region under an interference condition achievable in the present invention.
Figure 12A:
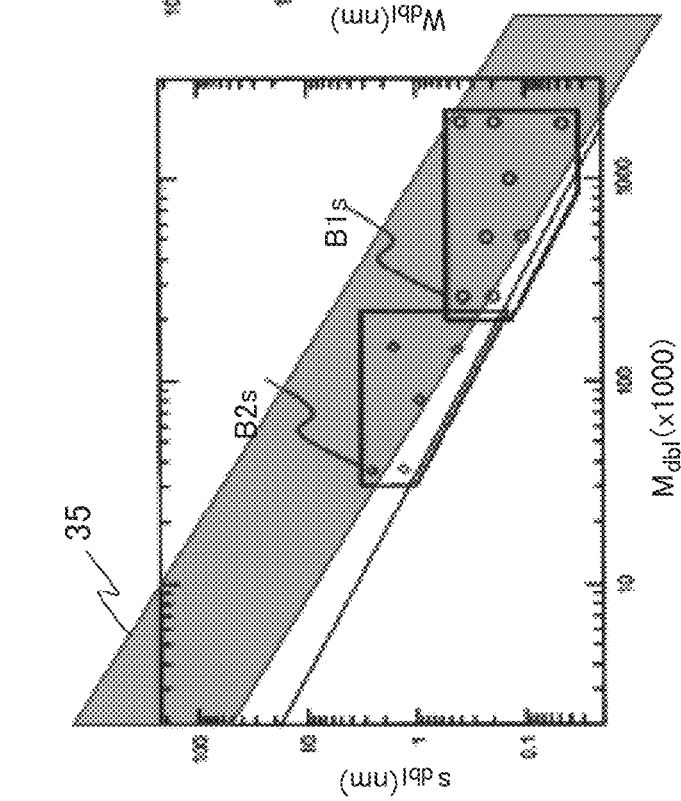

FIGS. 12A and 12B are drawings where a region 35 under the interference condition achievable in the present invention is added on a range, illustrated in FIG. 11 and FIG. 12 in WO2010/026867, under the interference condition to avoid the superimpose of the Fresnel stripes achievable by the interferometer. According to the present invention, for obtaining the magnification necessary for the electron microscope, increasing at least one stage of lens on the upstream side of the interference optical system is considered to provide a practical design. Accordingly, the magnification can be increased by one digit, thus expanding the regions 35 illustrated in FIGS. 12A and 12B to lower right side. In addition, since the magnification imaging optical system and the interference optical system are mutually independent, the interference condition can be comprehensively achieved. Then, the regions 35 are continuously illustrated in FIGS. 12A and 12B.

It should be noted that the present invention is not limited to the above-described examples, and various modifications are included. For example, the above-described examples are described in details for better understanding of the present invention, and are not intended to limit to necessarily include every configuration described. A part of a configuration of a certain example can be replaced with a configuration of another example, and a configuration of another example can be added to a configuration of a certain example. A part of configurations of each example can be subjected to an addition of another configuration, removal, and replacement.

LIST OF REFERENCE SIGNS 1, 32 interference optical system unit
2 electromagnetic lens
3 biprism
4 first biprism
5 second biprism
6 optical system sub unit
7 first electromagnetic lens
8 second electromagnetic lens
9 deflector
10 first deflector
11 second deflector
12 detection recorder
13 computer
14 voltage application or current supply unit
20 light source
21 first irradiation lens
22 second irradiation lens
23 specimen
24 objective lens
25 first biprism
26 first middle lens
27 second biprism
28 second middle lens
29 first projection lens
30 second projection lens
31 detection recorder
33 lens of interference optical system
34 imaging lens
35 region
70, 80 table

What is claimed is:

1. An interference optical system unit comprising:
at least one electromagnetic lens that forms an image of a charged particle beam; and
at least one charged particle beam biprism;
wherein the electromagnetic lens, the charged particle beam biprism, and a space to an image plane of the electromagnetic lens are integrally configured as one unit,
the interference optical system unit is disposed to have an optical axis coaxialized with an optical axis of an imaging optical system of an upstream stage, the imaging optical system being disposed on an upstream side of the unit in a flow direction of the charged particle beam, and
a focal length of the electromagnetic lens and a deflection angle of the charged particle beam given by the charged particle beam biprism are controlled to generate an interference fringe of the charged particle beam on the image plane of the electromagnetic lens.

2. The interference optical system unit according to claim 1, further comprising two charged particle beam biprisms,
wherein a first charged particle beam biprism of the two charged particle beam biprisms is disposed on an object plane of the electromagnetic lens and a second charged particle beam biprism is disposed between a back focal plane of the electromagnetic lens and an image plane.

3. The interference optical system unit according to claim 1, further comprising an optical system sub unit including a second imaging optical system and a space to an image plane of the second imaging optical system, the second imaging optical system forming an image with the image plane of the electromagnetic lens as an object plane, the second imaging optical system including at least one electromagnetic lens.

4. The interference optical system unit according to claim 1, further comprising at least one deflector that acts to deflect a flow direction of the charged particle beam in a direction having a finite angle with a z-axis when an optical axis of an optical system of a charged particle beam device other than the interference optical system unit is assumed to be the z-axis.

5. The interference optical system unit according to claim 1, wherein an imaging action by the electromagnetic lens of one-stage included in the interference optical system unit is performed with any magnification from two times to 50 times.

6. The interference optical system unit according to claim 1, further comprising a detection recorder that records an interference image.

7. The interference optical system unit according to claim 1, further comprising a control system as a part of components that constitute the unit, the control system controlling the focal length of the electromagnetic lens included in the interference optical system unit and the deflection angle given to the charged particle beam by the charged particle beam biprism.

8. A charged particle beam interference apparatus comprising:
a light source of a charged particle beam;
an irradiation optical system that irradiates a specimen with the charged particle beam emitted from the light source of the charged particle beam;
an objective lens system that includes at least one electromagnetic lens to form an image of the specimen;
an imaging optical system that includes at least two electromagnetic lenses to magnify and form or demagnify and form the image of the specimen formed by the objective lens system;
an interference optical system that forms an interference image from the image of the specimen formed by the imaging optical system; and
a detection recorder that detects and records the interference image of the specimen,
wherein, in an order along a flow direction of the charged particle beam, the light source of the charged particle beam, the irradiation optical system, the objective lens system, the imaging optical system, the interference optical system, and the detection recorder are disposed in said order along the flow direction of the charged particle beam,
wherein the interference optical system includes at least one electromagnetic lens that forms an image of a charged particle beam, and at least one charged particle beam biprism,
wherein the at least one electromagnetic lens of the interference optical system, the charged particle beam biprism, and a space to an image plane of the electromagnetic lens of the interference optical system are integrally configured as one unit, and
wherein a magnification of the interference image of the specimen is changed by the electromagnetic lens included in the imaging optical system disposed upstream with respect to the interference optical system.

9. The charged particle beam interference apparatus according to claim 8,
wherein the interference optical system includes at least one electromagnetic lens that forms an image of the charged particle beam and two charged particle beam biprisms, and
a first charged particle beam biprism of the two charged particle beam biprisms is disposed on an object plane of the electromagnetic lens, and a second charged particle beam biprism is disposed between a back focal plane of the electromagnetic lens and an image plane.

10. The charged particle beam interference apparatus according to claim 8, wherein the interference optical system includes a second imaging optical system and a space to an image plane of the second imaging optical system, the second imaging optical system including at least one electromagnetic lens that forms an image with the image plane of the electromagnetic lens as an object plane.

11. The charged particle beam interference apparatus according to claim 8, wherein the interference optical system includes a deflector of the charged particle beam.

12. The charged particle beam interference apparatus according to claim 8, wherein an imaging function by the electromagnetic lens included in the unit is performable with any magnification from two times to 50 times.

13. The charged particle beam interference apparatus according to claim 8, wherein a part including the detection recorder in addition to the interference optical system is configured as an integrated unit.

14. The charged particle beam interference apparatus according to claim 8,
wherein the interference optical system is configured as the integrated unit, and
the interference optical system further includes a system as a component of the unit, the system controlling a focal length of the electromagnetic lens included in the unit and a deflection angle given to the charged particle beam by the charged particle beam biprism.

15. A method for observing a charged particle beam interference image using a charged particle beam interference apparatus, the method comprising:
- irradiating a specimen, using an irradiation optical system, with a charged particle beam emitted from a light source of the charged particle beam;
- forming an image of the specimen using an objective lens system that includes at least one electromagnetic lens;
- magnifying and forming, or demagnifying and forming, the image of the specimen formed by the objective lens using an imaging optical system that includes at least two electromagnetic lenses;
- forming an interference image from the image of the specimen formed by the imaging optical system suing an interference optical system; and
- detecting and recording the interference image of the specimen using a detection recorder,
- wherein, in an order along a flow direction of the charged particle beam, the light source of the charged particle beam, the irradiation optical system, the objective lens system, the imaging optical system, the interference optical system, and the detection recorder are disposed in said order along the flow direction of the charged particle beam,
- wherein an imaging condition of the interference optical system is kept to a preliminarily fixed constant condition, and
- wherein a setting and a change of an imaging magnification of the specimen is performed using the electromagnetic lens included in the imaging optical system disposed on an upstream side of the interference optical system excluding the interference optical system.

* * * * *